United States Patent [19]

Bartuska et al.

[11] Patent Number: 4,511,841
[45] Date of Patent: Apr. 16, 1985

[54] METHOD AND APPARATUS FOR HIGH SPEED MAGIC ANGLE SPINNING

[75] Inventors: Victor J. Bartuska; David H. Lewis, both of Fort Collins; Robin B. Lewis, Bellvue; David G. Dalbow, Fort Collins, all of Colo.

[73] Assignee: Chemagnetics, Inc., Ft. Collins, Colo.

[21] Appl. No.: 389,449

[22] Filed: Jun. 17, 1982

[51] Int. Cl.³ ............................................. G01R 33/08
[52] U.S. Cl. ..................................... 324/321; 324/318
[58] Field of Search ........................ 324/321, 300, 318

[56] References Cited

U.S. PATENT DOCUMENTS

| | | | |
|---|---|---|---|
| 3,588,677 | 6/1971 | Kleiman | 324/321 |
| 4,201,941 | 5/1980 | Fyfe | 324/321 |
| 4,254,373 | 3/1981 | Lippmaa | 324/321 |
| 4,275,350 | 6/1981 | Hill | 324/321 |

OTHER PUBLICATIONS

"An Apparatus for Obtaining High Speeds of Rotation", by J. S. Beams, published Nov. 19, 1930.
"Sur la Realization de Tres Grandes Vitesses de Rotation", by Henriot and Huguenard, published May 11, 1925.
"A High-Speed Magic Angle Spinner", by Zilm et al., Journal of Magnetic Resonance, vol. 30, 1978, pp. 563-570.
"Quick Sample Change Probe for Magic Angle Spinning NMR", by Opella et al., Dept. of Chemistry, Univ. of Pennsylvania.
"A Magic-Angle Spinning System for Bullet-Type Rotors in Electromagnetics": published 1981; by Bartuska and Maciel.
"A Magic-Angle Rotor for NMR Using a Forced Gas Bearing", by Baliman et al., accepted for publication in 1979.
"Design of High Speed Cylindrical NMR Sample Spinners", by Doty and Ellis, published Dec. 1981.
"Airfuge Ultracentrifuge", by Beckman Instruments (brochure) 1979.
"The Air-Driven Ultracentrifuge/a Rediscovered Wonder", by Spinco Division of Beckman Instruments; in Fractions; 1980.

Primary Examiner—Michael J. Tokar
Attorney, Agent, or Firm—Young & Martin

[57] ABSTRACT

A nuclear magnetic resonance spinning apparatus includes an elongated cylindrical sample rotor with slotted air vanes on one tapered end thereof, an axial stator air drive and air end bearing, and a lateral ring air bearing around the opposite end of the rotor. The lateral end bearing retains the spinning axis at a precise pre-set angle, and the slotted air vanes are designed for high speed, low pressure applications. An adjustable cradle support mounts the spinning apparatus in a manner that allows convenient spin angle adjustment, and an insulated probe is provided with a convenient access opening and door structure for access to the spinning apparatus mounted therein.

31 Claims, 13 Drawing Figures

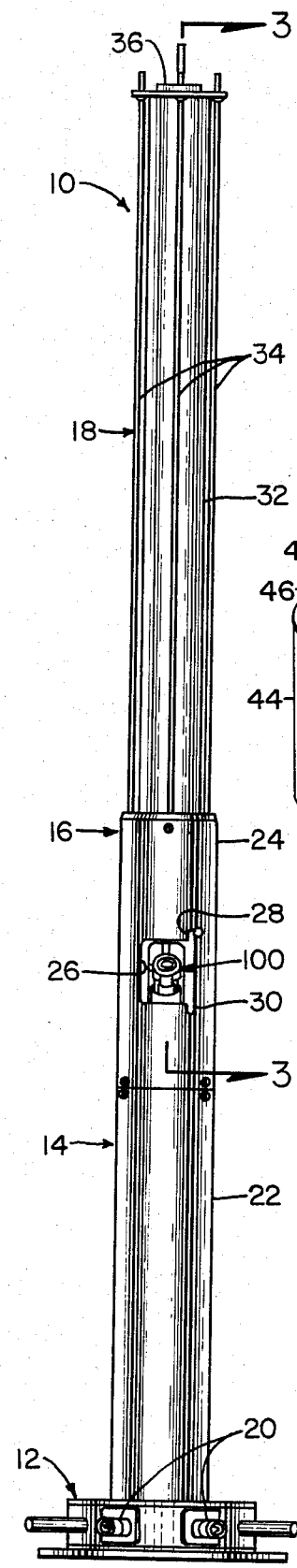
FIG. 1
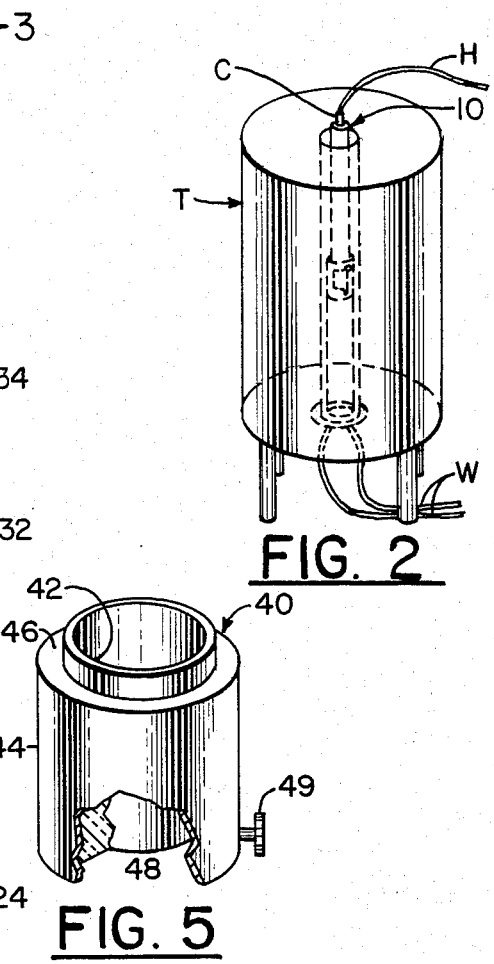
FIG. 2
FIG. 5
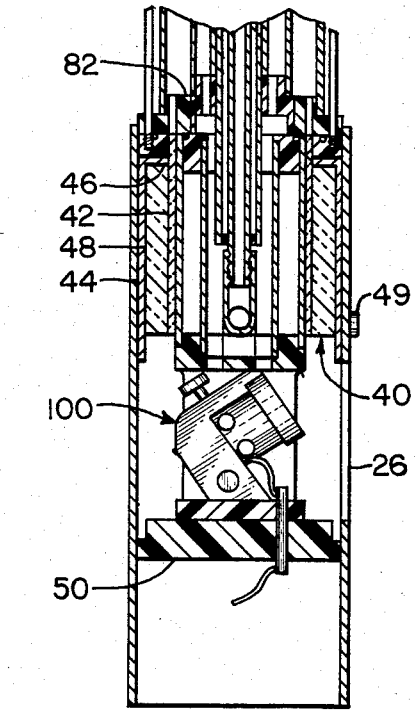
FIG. 4
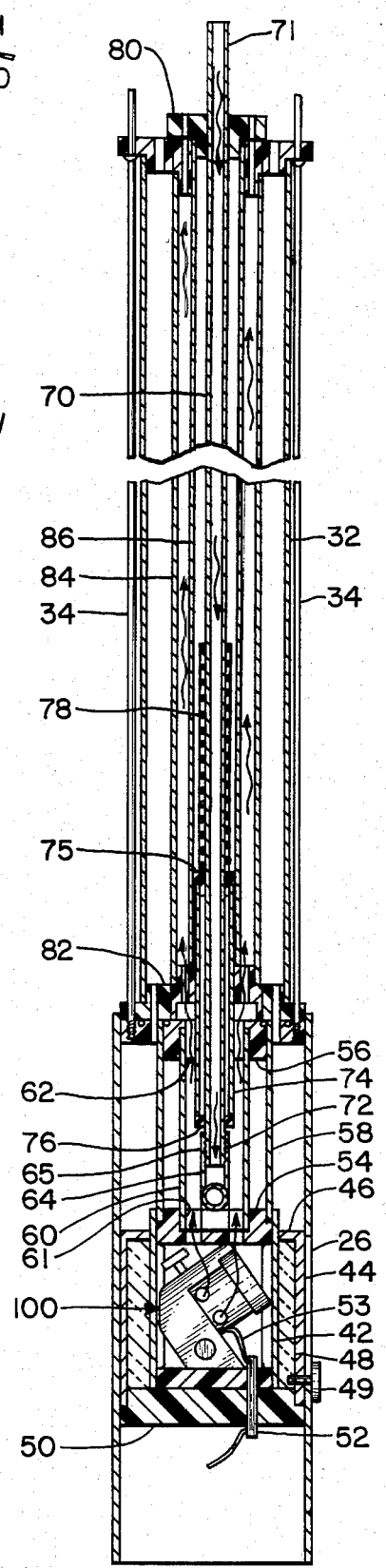
FIG. 3

METHOD AND APPARATUS FOR HIGH SPEED MAGIC ANGLE SPINNING

BACKGROUND

The present invention is related to method and apparatus for determining nuclear magnetic resonance (NMR) testing apparatus, and more particularly to an improved method and apparatus for spinning sample capsules at a high speed for NMR.

Nuclear magnetic resonance (NMR) is a technique used to determine the characteristics of a sample and to identify or compare molecular structures and compositions that are unique to the material being tested for purposes of identification or analysis. When materials are subjected to electromagnetic radiation of the correct frequency and orientation, they respond by emitting electromagnetic radiation in return from the nuclei contained in the sample, and the characteristics of the electromagnetic radiation emmitted are unique to the particular material. Therefore, if the characteristics of the emitted radiation can be detected with sufficient accuracy, then the material can be fingerprinted by such characteristics for identification, comparison or analysis.

It is also known that if NMR measurements on immobile (e.g., solid) samples are performed while spinning the material at the "magic angle" of 54.7 degrees to a strong magnetic field, the detail and accuracy of the characteristics detected may be enhanced significantly. However, it is sometimes necessary to spin solid material samples at extremely high rates of speed to obtain high resolution resonance lines that indicate the unique characteristics of the material. Some samples require spinning in the range of up to 5,000 to 8,000 hertz (300,000 to 480,000 R.P.M.) to obtain usable results. Therefore, nuclear magnetic resonance (NMR) methods and apparatus are directed to positioning a sample in a strong magnetic field and spinning it about a longitudinal axis, usually, but not always, oriented at the "magic angle" of 54.7 degrees to the magnetic field while alternately irradiating the sample with suitable electromagnetic radiation and receiving the resonant electromagnetic radiation emitted from the sample.

Drawing on the knowledge and experience obtained from high speed spinning apparatus used in ultra-centrifuges driven by jet air streams and utilizing air bearings to minimize friction, a number of NMR apparatus have been developed. A major problem in the field of NMR apparatus is the requirement that an antenna must be positioned as close as possible to the rotating material for transmitting and receiving electromagnetic radiation. While a number of such devices have been developed and used with satisfactory results prior to the development of this invention, all of the prior art devices encountered one or more of a number of persisting problems. Due to the unique requirements of very high speed spinning while maintaining precise orientation to the magic angle in the presence of a closely spaced antenna coil around the sample, any variation from the spinning angle results in deterioration of results. Most of the prior art NMR spinners utilize gas jets to provide the driving force and some type of air bearing to provide support and stability. The most common of such devices utilize the Andrew-Beams structure of a conical axial end bearing, derived from earlier developments in ultra-centrifuge design, on the Lowe-Norberg types of transverse air jets and bearings. However, in order to achieve the required combination of speed, stability, and proximity of antenna components, major components of the prior art apparatus, such as the antenna structure, air drive, or air bearing structure must be disassembled when a sample material is positioned in the testing apparatus or removed from the testing apparatus. Also, particularly in the transverse type prior art NMR spinners, impractically high tolerances of machined components are necessary for the apparatus to maintain precise magic angle or other desired angle at all speeds of spinning. Therefore, these devices suffer from the requirement of impractically high spacial tolerances in manufacturing and machining as well as the necessity of rigid, exotic, and difficult to manufacture materials for container capsules and rotors in order to function. The extremely high tolerances and close clearances of components required in these devices leads to additional problems. For example, in such prior art devices, excessive gaseous fluid drive pressures are required to spin the components at very high speeds. Such high operating pressures can cause a variety of difficulties, such as gas leaks and liquification of the drive fluid in the spinning drive mechanism. Since some materials require NMR testing at extremely cold temperatures for high resolution test results, this problem of liquification of the drive the fluid can inhibit use of desirable cryogenic gases, such as nitrogen, necessary or desireable to conduct extremely cold temperature testing.

In general, the conical type spinner apparatus have the advantage of less rigid tolerances and better capabilities of reaching high speeds with low gas drive pressures, but they suffer from lack of angle accuracy. They also require dissasembly of the components to remove samples due to enlarged conical structures heretofore desired necessary for approaching accurate magic angle maintenance. On the other hand, the transverse type spinner apparatus have the advantages of accurate angle maintenance, but they suffer from impractically close tolerances, expensive materials, difficulty of manufacture, high operating pressures, extreme care required in packing the sample material, and disassembly to remove samples.

SUMMARY OF THE INVENTION

Accordingly, it is an object of the present invention to provide novel method and apparatus for high speed spinning which is capable of maintaining precisely the magic angle or other desired angle orientation to a magnetic field throughout all speeds of rotation, including the range of 5,000 to 8,000 hertz.

It is also an object of the present invention to provide NMR spinning apparatus capable of reaching extremely high rates of speed and maintaining precise angle accuracy while utilizing relatively inexpensive materials and relatively low spacial tolerances.

It is also an object of the present invention to provide high speed NMR spinning apparatus which is convenient to use and in which samples can be inserted into and removed from the apparatus without disassembly of stater components.

A further object of the present invention is to provide high speed NMR spinning apparatus that can spin a sample material to be tested at extremely high rates of speed in the range of 5,000 to 8,000 hertz while utilizing relatively low pressure, high volume gaseous fluid flow for driving the apparatus.

A still further object of the present invention is to provide high speed NMR spinning apparatus capable of operating with extremely cold cryogenic gaseous drive fluids.

It is also an object of the present invention to provide novel probe apparatus for mounting and operating the high speed NMR spinner assembly in an insulated environment, while being easily accessible from the exterior for inserting and extracting material samples to be tested.

The high speed NMR spinning apparatus of the present invention utilizes an elongated cylindrical, bullet shaped rotor or spinner for containing a material to be tested that is supported and driven by an axial air bearing and stator assembly for axially supporting and rotating the capsule in combination with a lateral end bearing on the opposite end of the rotor for maintaining the attitude of the capsule at precisely the magic angle of 54.7 degrees or any other desired angle to a magnetic field throughout all ranges of rotational speed. The lateral end bearing is in the form of a circular ring surrounding the end of the rotor with a plurality of ports therein for directing the jet streams of gaseous fluid perpendicularly onto the lateral surface of the rotor to provide a transverse air bearing effect. The elongated, bullet-like shape of the rotor capsule is provided with a tapered end section having a base no greater than the circumference of the cylindrical rotor for use of insertion and removal of the rotor from the spinning assembly. A unique slotted vane structure is provided on the tapered end section of the rotor capsule to effectively drive the elongated rotor at extremely high speeds with relatively low air pressure.

The invention also includes a unique insulated probe structure for mounting the capsule spinner assembly in a magnet. The structure of the probe allows convenient access to the capsule spinner assembly, while maintaining desired operating temperatures therein.

BRIEF DESCRIPTION OF THE DRAWINGS

Other objects, advantages, and capabilities of the present invention will become more apparent as the description proceeds, taken in conjunction with the following drawings, in which:

FIG. 1 is a side elevation view of the high speed NMR spinning probe of the present invention with the access door shown in the open position to reveal the NMR spinner assembly therein;

FIG. 2 is a simplified perspective view showing the environment in which the NMR spinning probe of the present invention is generally utilized in the air bore of a magnet;

FIG. 3 is a cross-sectional view of the middle and upper sections of the NMR spinning probe of the present invention, taken approximately along lines 3—3 in FIG. 1, and showing the access opening closed;

FIG. 4 is a cross-sectional view of the mid-section of the probe similar to FIG. 3, but with the access opening in the open position;

FIG. 5 is a perspective view of the insulated cylindrical plenum, which encloses the capsule spinner assembly during use and also functions as a slidable access door;

BRIEF DESCRIPTION OF THE PREFERRED EMBODIMENTS

Figure 6:
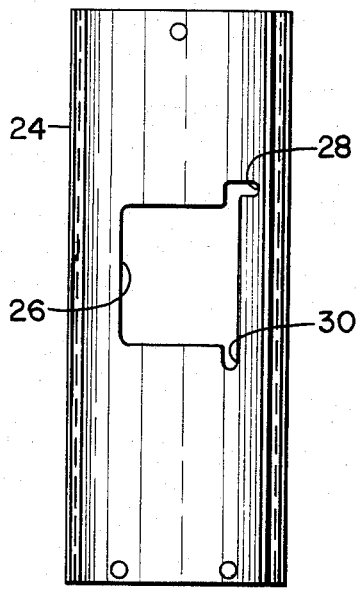
FIG. 6 is a enlarged front elevation view of the cylindrical housing that encloses the mid-portion of the probe, showing the the details of the access openings therein.

The high speed NMR spinning probe 10 of the present invention is shown in FIG. 1. The probe 10 is an elongated structure basically comprised of a base 12, bottom section 14, mid-section 16, and top section 18. The bottom section 14 has a elongated cylindrical bottom housing 22 which encloses electronic sensing and transmitting components that are commonly used in nuclear magnetic resonance testing with magic angle spinning apparatus. Since these electronic sensing and transmitting components are conventional and well known in this type of apparatus, they form no part of the claimed invention and are not shown in the drawings.

The mid-section 16 is enclosed by an elongated cylindrical housing 24, which contains the high speed magic angle spinning assembly 100 of the present invention. An access opening 26 is provided in the cylindrical housing 24 to provide access to the magic angle spinner assembly 100. This access opening can be closed during use by a unique plenum closure of the present invention, which will be described in more detail below.

The top section 18 includes an elongated cylindrical housing 32 and gaseous driving fluid conductor tubes, which will also be discussed in more detail below. The top section 18 is fastened to the middle section 16 by a plurality of elongated rods 34 extending upwardly from the mid-section 16 to the top end cap 36.

The NMR spinning probe 10 of the present invention is designed for conventional use in nuclear magnetic resonance (NMR) testing of materials, and it is especially adapted for measurements at very low temperatures in the environment of a super conductor electromagnetic field. The elongated probe 10 is adapted for positioning in a vertical core C through the center of a cryogenic tank T as shown in FIG. 2. In a typical application, a super conductor magnet (not shown) is positioned in the tank T around core C. The tank T is then filled with a cryogenic fluid, such as liquid nitrogen, to super cool the super conducting wire windings of the electromagnet. When the magnet is energized, it creates a very high power magnetic field F oriented vertically through the core C of the tank T. The hose H at the top of the tank supplies a pressurized gaseous fluid to the probe 10, and the wires W conduct the electronic output and input to other components of the NMR apparatus.

The internal structures of the mid-section 16 and the top section 18 of the probe 10 are best seen in FIG. 3.

The mid-section 16 is comprised primarily of a capsule spinner assembly 100 mounted in a cradle assembly 102, which is positioned on and supported by block 50 near the bottom of cylindrical housing 24. A slidable air plenum 40 is positioned around the capsule spinner assembly 100. Above the cradle 102, a plurality of cylindrical conduits and tubes are provided to conduct gaseous drive fluid to and from the capsule spinner assembly 100 and to insulate these tubes and conduits.

The top section 18 has an elongated cylindrical housing 32 extending upwardly from the mid-section 16. This cylindrical housing 32 contains a plurality of elongated tubes and conduits for carrying gaseous drive fluid to and from the mid-section 16 and insulating those tubes and conduits from the exterior environment in the core C of the tank T. This top section 18 is constructed so that it can be detached and removed from the mid-section 16 from the top of the tank T without removing the bottom section 14 or mid-section 16 from the core C.

In the space above the cradle 102 in mid-section 16, an exhaust tube 60 extends between the top 104 of the cradle 102 and the upper end plug 56 at the top of cylindrical housing 24. This exhaust tube 60 is positioned concentric with the cylindrical housing 24. An intermediate cylindrical lining 58 is positioned concentrically between the exhaust tube 60 and the cylindrical housing 24, and it extends from the top 104 of the cradle 102 to the upper spacer block 56. This intermediate cylindrical lining 58 isolates the exhaust tube 60 from the space adjacent the the housing 24. Therefore, these annular spaces function as annular insulation layers between the housing 24 and the intermediate liner 58 and between the intermediate liner 58 and the exhaust tube 60. The exterior surface of the intermediate tube 58 also functions as a guide for the sliding exhaust air plenum 40, which will be described in more detail below.

The top section 18 also has a pair of concentric elongated tubes therein. Exhaust tube 84 and liner tube 86, which is inside the exhaust tube 84, both extend from the bottom end cap 82 to the top end cap 80 in the cylindrical housing 32. Elongated retainer rods 34 extend from the top of upper end block 80 through the bottom end block 82 and screw into the top end block 56 of mid-section 16. Therefore, these elongated retainer rods 34 can be unscrewed from the top of the tank to separate the upper section 18 from the mid-section 16.

In order to accommodate insertion and removal of the gas feeder tubes 70, a guide tube 74 extends from inside the lower portion of liner tube 86 through the end caps 82, 56 and into the exhaust tube 60 in the mid-section 16. Therefore, the gas feeder tube 70 can be inserted into the probe 10 from the top when the top section 18 is attached to the mid-section 16. It is inserted through the center hole in top cap 80. It is then moved downwardly through the packer 75 at the upper end of guide tube 74 and through the bottom packer 76 in the bottom of guide tube 74. At that point, the lower externally threaded end 72 of gas feeder tube 70 can be screwed into the inlet header 64. The inlet header 64 is connected to the capsule spinner assembly as will be described in more detail below.

A source of gaseous fluid can then be connected to the upper end 71 of gas feeder tube 70 to supply a gaseous fluid under pressure to drive the capsule spinner assembly 100. Therefore, the gaseous fluid is fed through gas feeder tube 70 as shown by the flow arrows therein downwardly into the capsule spinner assembly 100. Exhausted gaseous fluid from the capsule spinner assembly 100 flows upwardly through ports 61 in the top 104 of cradle 102 into the exhaust tube 60. The exhausted gaseous fluid continues to flow upwardly as shown by the flow arrows in FIG. 3 through the port 62 in top spacer block 56 and through ports 81 in bottom end cap 82 to the annulus of exhaust tube 84 in top section 18. The exhausted gases continue to flow upwardly through the annulus inside exhaust tube 84 and outside liner 86 to the top of the probe 10. The exhausted gas then escapes through ports 85 in top end cap 80 to the atmosphere or to some other suitable gathering apparatus (not shown).

The annulus in the interior of liner tube 86 and outside gas feeder tube 70 insulates the gaseous fluid in feeder tube 70 from the exhausted fluid in exhaust tube 84. The space between the cylindrical housing 32 and the exhaust tube 84 provides further insulation for the interior tubes from the exterior environment.

An electric heating coil 78 is positioned in the top section 18 around gas feeder tube 70 just above the guide tube 74 to provide additional temperature control for the gaseous fluid directed into the capsule spinner assembly 100. For example, if an extremely cold cryogenic fluid, such as gaseous nitrogen boiled off liquid nitrogen, is used for driving the capsule spinner assembly in low temperature experiments, the coil 78 can be used to heat the cryogenic fluid to any desired temperature as required for the particular test being conducted. A suitable temperature sensor, such as a thin film detector (not shown) can be positioned in the gas feeder tube 70 downstream from the coil 78 to control the electric input to the coil.

During operation of the capsule spinner assembly 100, an insulated plenum 40 is positioned around the capsule spinner assembly 100. The structure of this insulated plenum 40 is best seen in FIGS. 3, 4, and 5. Referring primarily to FIG. 5, the plenum 40 includes an inner cylindrical liner 42 and outer cylindrical liner 44 positioned concentrically around inner liner 42. An insulating material 48 is placed in the annulus between the inner liner 42 and outer liner 44. An annular end cap 46 at the top of outer liner 44 returns inwardly to seal against the inner liner 42.

As shown in FIG. 3, this plenum 40 is slidably positioned inside the cylindrical housing 24 of mid-section 16 and over the capsule spinning assembly 100. Therefore, as gaseous fluid is exhausted from ports 146 in the capsule spinning assembly 100, the plenum 40 confines the flow of such exhausted gaseous fluid and directs it upwardly into the exhaust tube 60, through which it is exhausted to the exterior as described above.

In order to insert and remove a sample, which may be in the form of a solid rotor or a sample contained in a capsule, into the spinner assembly 100, an access hole 26 is provided in the side of the cylindrical housing 24 adjacent the spinner assembly 100. This access hole 26 is shown in FIGS. 1, 3, 4, and 6. When the plenum 40 is positioned over the capsule spinner assembly 100, as shown in FIG. 3 and described above, a portion of the outer liner 44 of plenum 40 is positioned over and closes the access opening 26. Therefore, in order to gain access through the access hole 26 to capsule spinner assembly 100, the plenum 40 must be moved upwardly, as shown in FIG. 4.

The plenum 40 is sized and configured to slide upwardly in the annulus between cylindrical housing 24 and the intermediate cylindrical tube 58. The inner tube 42 of plenum 40 slides over the exterior surface of cylindrical tube 58, and the exterior surface of outer cylinder 44 of plenum 40 slides along the interior surface of cylindrical housing 24 as the plenum 40 moves upwardly to expose the capsule spinning assembly 100 to the exterior of housing 24. With the plenum 40 slid upwardly as shown in FIG. 4, the access opening 26 is not obstructed, so access to the capsule spinning assembly 100 is available therethrough.

In order to retain the air plenum 40 in either the closed or opened position, slots 28, 30 as best shown in FIG. 6, are provided at the upper and lower right corners, respectively, of access opening 26. A screw 49 is threaded into the lower edge of outer cylinder 44 of plenum 40, as shown in FIGS. 3 and 5. The screw 49 extends outwardly from plenum 40 through the access opening 26 to the exterior of cylindrical housing 24. When it is desired to lock the plenum 40 in closed position, the screw 49 is positioned in the slot 30 at the lower right corner of access opening 26 and tightened therein against the exterior of housing 24, as shown in FIG. 3. Conversely, when it is desired to lock the plenum 40 in the open position, the screw 49 is positioned in the slot 28 at the upper right corner of access opening 26 and tightened therein as shown in FIG. 4.

Figure 8:
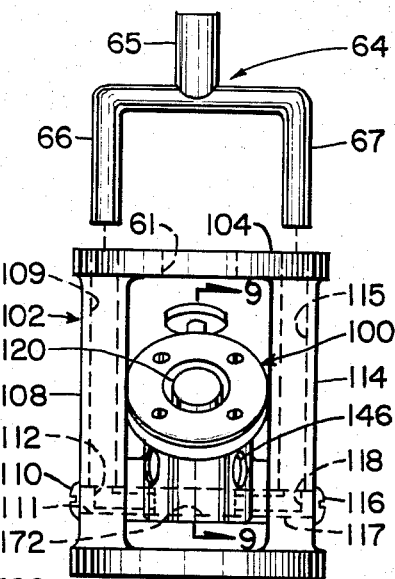
FIG. 8 is a front elevation view of the capsule spinner assembly and mounting cradle of the present invention.
Figure 9:
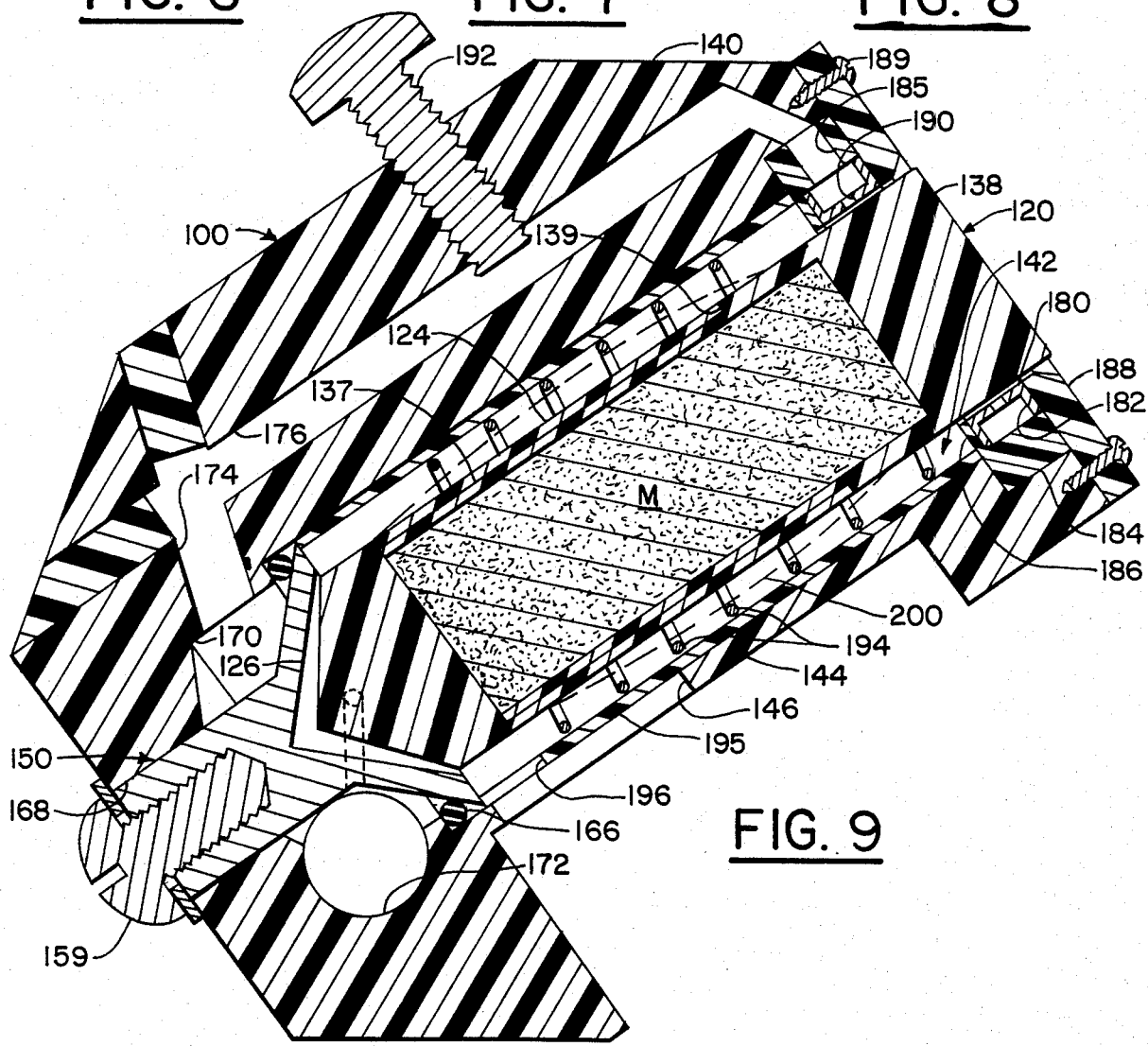
FIG. 9 is an enlarged cross-sectional view of the capsule spinner assembly of the present invention taken approximately along lines 9—9 of FIG. 8.
Figure 10:
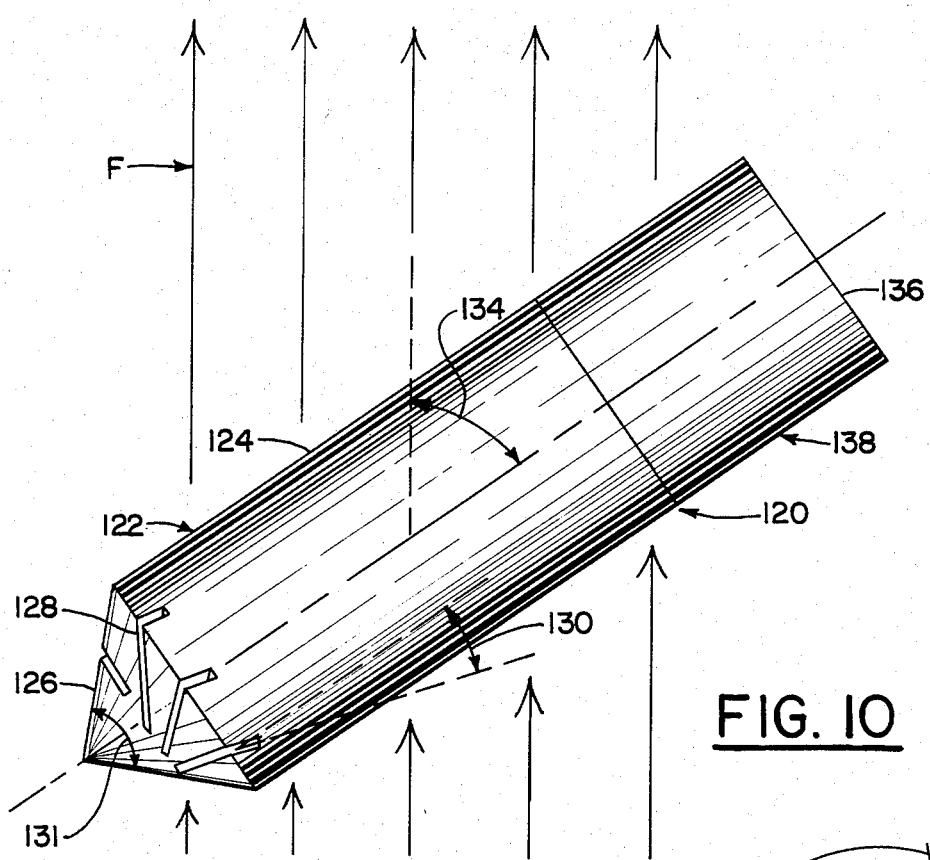
FIG. 10 is an enlarged elevation view of the sample container capsule of the present invention positioned at the magic angle in a magnetic field.

The structure of the capsule spinner assembly 100 of the present is best shown in FIGS. 7 through 13. The sample capsule or rotor 120 is shown in FIG. 10 positioned in a magnetic field F with its longitudinal axis at the magic angle of 54.7 degrees from the direction of the magnetic field F, as indicated at 134. As mentioned above, it is often critical to nuclear magnetic resonance (NMR) of some kinds of samples that the longitudinal axis of the spinning capsule or rotor 120 be maintained precisely at the magic angle 134 of 54.7 degrees. The spinner assembly 100 of the present invention is designed to maintain the spinning angle 134 precisely at 54.7 degrees, or any other desired angle, throughout the nuclear magnetic resonance procedure. This orientation is accomplished by positioning the housing 140 in the cradle 102 so that the rotor cavity 142 in the housing 140 is precisely at the magic angle or other desired angle in relation to the magnetic field. Further, a unique feature of this invention is the lateral end air bearing 180, shown in FIG. 9 which is effective to maintain the end 138 of capsule or rotor 120 at precisely the angle desired as it is spinning in the rotor cavity 142.

As best seen in FIGS. 9 and 10, the capsule or rotor 120 is comprised of two sections, a front end section 122 and a rear end section 136 which fit together to form an enclosed cylindrical capsule for containing a sample M to be tested for nuclear magnetic resonance (NMR) characteristics. The front end section 122 is comprised of an elongated cylindrical body 124 with a closed solid conical end 126. The resulting shape of the capsule 120 is an elongated bullet-like appearance with the length of the cylindrical container preferably equal to or greater than two times the diameter. A plurality of slotted vanes are provided around the peripheral surface of the conical end 126 to react with a jet stream of pressurized gaseous fluid, such as air, nitrogen, or the like to rotate the capsule 120.

The rear end section 136 is also comprised of a cylindrical container 137 sized to slide inside the cylindrical body 124 of the front end section 122. A solid end cap 138 encloses the rear end section 136, and the diameter of the end cap 138 is the same as the diameter of the cylindrical body 124 of front end section 122. Therefore, when the capsule 120 is assembled as shown in FIGS. 9 and 10 with the cylindrical body 124 abutted against the shoulder 139 of end cap 138, the capsule has a uniform diameter throughout its entire length. The conical end section 126 is tapered uniformily from its base to converge at its apex on the longitudinal axis of the cylindrical capsule 120 at an apex angle 131 of about 104 degrees.

Since the base of the conical end section 126 is the same circumference as the cylindrical body 124 and end cap 138, the capsule 120 has a uniform, bullet-shaped appearance with no radially protruding shoulders or other appendages that could interfere with its insertion through the lateral end bearing 180. This feature is significant because it allows the capsule or rotor 120 to be inserted into the rotor cavity 142 and removed therefrom through the lateral end bearing 180 without requiring any disassembly of the capsule spinner apparatus when the NMR measurement is started or completed.

Figure 11:
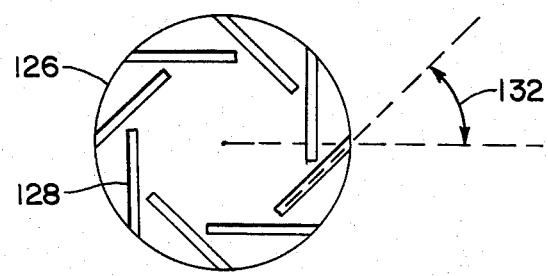
FIG. 11 is an end view of the material container capsule showing the vane structure therein.

As best shown in FIGS. 10 and 11, eight slotted vanes are cut into the solid conical end section 126 in equal spaced apart relation to each other around the peripheral surface of the conical end section 126. The configuration and orientation of these vane slots are uniquely adapted for efficient high speed spinning with relatively low pressure, high volume gaseous drive fluid. Each slotted vane 128 is slanted inwardly toward the longitudinal axis at an angle 130 of about 15 degrees, as indicated at 130. They extend inwardly from the peripheral surface at an angle of about 45 degrees from the radius of the conical end section 126, as indicated at 132. This vane structure is efficient for spinning the capsule 120 over a wide range of speeds with relatively low drive fluid pressure. For example, this capsule or rotor 120 can be spun at speeds in the range of about 5,000 to 8,000 hertz (300,000 to 408,000 R.P.M.) with only about 15 to 40 p.s.i. pressure. This pressure range is about one-third to one-half the pressure required by prior art devices for spinning capsules in such high speed ranges and is a significant factor in allowing the use of very low temperature experiments with cryogenic gaseous drive fluids, such as nitrogen, that have a tendency to liquify at higher pressures. The spinning apparatus of this invention has been used successfully in temperature as cold as −190 degrees centrigrade. On the other hand, the capsule or rotor 120 of this invention can be spun efficiently and reliably with very low drive pressures, such as 2 to 4 p.s.i. for speeds in the range of 1,000 to 2,000 hertz. Of course, its use is not limited to low temperature applications and can be used for higher temperature environments when made of materials that can withstand such higher temperatures. While a capsule container structure 120 is usually used for NMR samples, a solid sample can also be shaped with the elongated cylindrical, bullet-like external configuration described above, including the conical end section and vanes, and inserted at the rotor directly into the spinner assembly 100.

Figure 7:
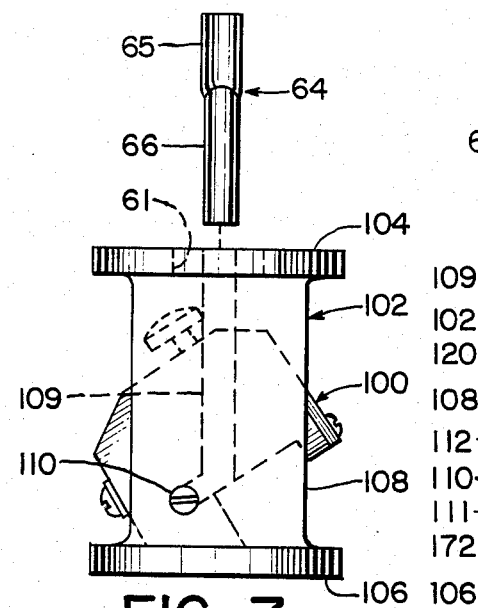
FIG. 7 is a side elevation view of the capsule spinner assembly and mounting cradle of the present invention.
Figure 13:
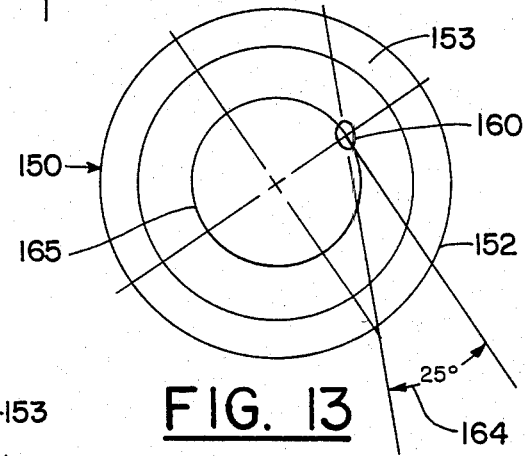
FIG. 13 is an end view of the stator showing the attitude of the jet ports therein.
Figure 12:
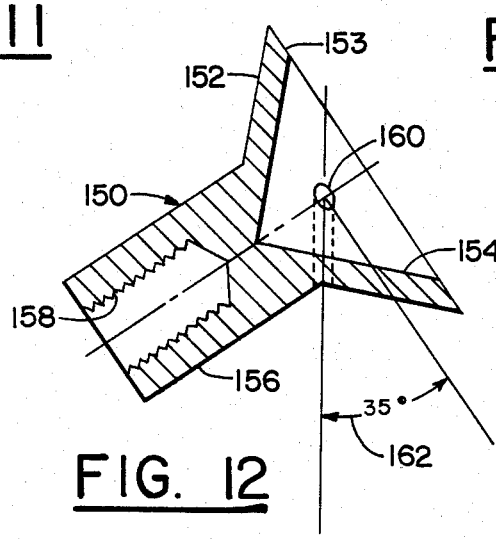
FIG. 12 is an enlarged cross-sectional view of the stator of the capsule spinning assembly of the present invention.

Referring now to FIGS. 7, 8, and 9, the capsule spinner assembly 100 includes a solid housing 140 with a rotor cavity 142 extending therein for receiving therein the material container capsule or rotor 120. A stator 150 is positioned at the bottom of the rotor cavity 142 for spinning the rotor 120. Referring to FIGS. 12 and 13, in addition to FIG. 9, the stator is comprised of a top end 152 having a conical cavity 154 therein and a shank 156 extending downwardly from the top end 152. The shank end 156 has an internally threaded bore 158 extending therein to accommodate a screw 159 used to fasten the stator 150 in the housing 140. An O-ring seal 166 is positioned under the lip 153 of the top end of the stator to seal the top end 152 of the stator 150 in the housing 140 against the escape of pressurized gaseous fluid.

An enlarged plenum cavity 170 in the housing 140 surrounds the back side of the top end 152 of stator 150. Gaseous fluid under pressure is directed into plenum cavity 170 through an inlet duct 172. A plurality of jet stream ports 160 extend from the plenum cavity 170 around the back side of the top end 152 through the stator 150 and into the conical cavity 154. Although one such jet stream port 160 is illustrated in FIGS. 9 and 12 for simplicity and clarity, there are preferrably a plurality of such jet stream ports 160 extending through the stator in a circular pattern, such as on the circle 165 shown in FIG. 13. It has been found that eight of such jet stream ports 60 positioned in angularly spaced apart relation to each other around the circle 165 provides satisfactory results. The jet stream ports 160 are preferably drilled through the stator wall at a slant angle 162 of about 35 degrees from the base of the cone and at an attitude angle 164 of 25 degrees from the tangent of the circle 165.

When a gaseous fluid under pressure is directed through inlet duct 172 into plenum cavity 170, which surrounds the upper end 152 of stater 150, the gaseous fluid is jetted through ports 160 into the conical cavity 154 of the stator 150. The jet fluid streams through ports 160 are directed into the slotted vanes 128 in rotor 120. The angular direction of the jet stream in combination with the angular orientation of the slotted vanes 128 efficiently impart a high speed rotary motion to the rotor 120. The compressed air film in the conical cavity 154 of stator 150 also functions as an air bearing for the conical end section 126 of rotor 120 so that the rotor rotates with almost no friction. Also, the high speed spinning motion of the rotor 120, according to the Bernoulli principal, tends to force the rotor 120 into the cavity 154 of stator 150 and retains the rotor in that position turning on the axial air bearing formed by the top end 152 of stator 150.

The exhausted gaseous drive fluid escapes from the housing 140 through exhaust ports 146 in the rotor cavity wall 144. As mentioned above, the plenum 140 around the capsule spinner assembly 100 directs the exhausted air through the exhaust tubes 60, 84 of the probe 10 to the exterior.

Also, as mentioned above briefly, one of the unique features of this invention is the lateral end bearing 180, which holds the capsule or rotor 120 in perfect alignment with the magic angle, or any other desired anle, regardless of the speed at which the capsule 120 rotates. It is effective with relatively low spacial tolerances and allows the use of capsule or rotor 120 made of common, inexpensive materials such as plastic, with an elongated bullet-like configuration, in combination with an axial air bearing stator of the type illustrated herein. The lateral end bearing of this invention is in the form of a circular ring 180 positioned around the end cap 138 of the rotor 120 at the opening into the rotor cavity 142 with a plurality of jet stream ports 190 through its face adapted to direct jet stream of air into the space between the bearing face and the peripheral surface of the rotor 120. The ring 180 is preferably formed with a channel 182 around the outside thereof. An annular bearing seat 184 with an inwardly extending lip 186 on its bottom side holds the bearing 180 in position around the opening of the rotor cavity 142. A flat annular retainer cap 188 is positioned over the bearing 180 and bearing seat 184 and is fastened to the housing 140 by screws 189 to hold the bearing assembly in the position shown in FIG. 9.

When the channel or plenum 182 around the outside of bearing 180 is pressurized with a gaseous fluid, the fluid is directed through a plurality of ports 190 in the bearing 180 onto the peripheral surface of the end cap 138 of capsule or rotor 120. The resulting air film between the inside surface of bearing 180 and the peripheral surface of end cap 138 maintains the capsule orientation at the magic angle with negligable friction at the bearing surface. It has been found that directing these jet streams of gaseous fluid radially inward at right angles to the tangent of the rotor surface provides the most efficient results for maintaining the rotor 120 at the magic angle with low tolerances in spacial relationship between the bearing face and the rotor.

Pressurized gaseous fluid is directed to the channel or plenum 182 from the plenum cavity 170 through a series of ducts 174, 176 extending through the housing 140 and through the port 185 in bearing seat 184. An adjusting screw 192 extends through the housing 140 into duct 176. Therefore, the extent to which the adjusting screw 192 is screwed to protrude into duct 176 controls the amount of gaseous fluid and pressure in the end bearing 180. This feature accommodates acheiving an optimum balance between the air pressure and volume required in the stator to rotate the capsule rotor and the volume and pressure of gaseous fluid required by the lateral end bearing 180 to maintain the capsule rotor 120 precisely at the magic angle attitude or precisely at any other desired angle.

It has been found that the lateral end air bearing 180 of this invention is effective to maintain the attitude of the rotor 120 precisely at the desired angle with relatively loose tolerances, such as in the range of five one thousandths of an inch. The ability of this apparatus to operate efficiently and to maintain spin angle precision not only is conducive to relatively quick, easy shaping of a solid sample itself into a rotor for NMR spinning and measurement if desired.

Also, it is not uncommon for the side walls of the capsule rotor to bulge at mid-section as shown by the broken lines 200 in FIG. 9 when the capsule rotor spins at a high rate of speed, particularly when it is manufactured with a relative cheap material, such as plastic. Such distortion can be minimized by the use of more expensive materials, such as ceramics, to fabricate the capsule 120. However, such expensive capsule material 120 is not necessary or required with this bearing structure at the end 138 of the capsule 120, since the lateral end bearing 180 is positioned around the end only of the capsule 120, and not around its midsection. Of course, high temperature applications could necessitate the use of more rigid materials, such as ceramic, to withstand the heat, but clearance or spacial tolerance alone is not a significant limiting factor itself of the materials used to fabricate the rotor 120.

The antenna 194 is coiled around the inside surface of an elongated cylindrical sleeve 195 and positioned in the rotor cavity 142 to transmit electromagnetic radiation to the sample material M in the capsule rotor 120, as it spins at approximately 300,000 to 500,000 per minute and to receive resonance electromagnetic radiation emitted by the material M being tested. A plurality of openings 196 at the bottom of sleeve 195 allow the exhausted gaseous drive fluid to escape from the rotor cavity 142.

Referring now to FIGS. 7, 8 and 9, the capsule spinner assembly 100 is positioned in a cradle 102 in such a manner that it can be set at the magic angle or at any other desired angle. The cradle 102 includes a circular top 104 and a circular bottom 106 spaced apart in relation to each other. A left side wall 108 and a right side wall 114 extend between the top 104 and bottom 106 of the cradle 102. An air duct 109 extends from the top 104 downwardly through left side wall 108 to a transverse hole 111 near the bottom of sidewall 108. Likewise, an air duct 115 extends downwardly from the top 104 through right side wall 114 to a transverse hole 117 near the bottom. The housing 140 of capsule spinner assembly 100 is positioned between the left and right side walls 108, 114 with the transverse inlet duct 172 in housing 140 axially aligned with the transverse holes 111, 117 in left and right side walls 108, 114, respectively. A hollow screw 110 having a duct 112 therein as shown in FIG. 8, is screwed into the hole 111 and into one end of the inlet duct 172. Similarly, a hollow screw 118 having a duct 118 therein is screwed in hole 117 and into the opposite end of inlet duct 172. Therefore, when screws 110, 116 are screwed into the left and right side walls 108, 114 and into the housing 140 as shown in FIG. 8, gaseous drive fluid can flow through ducts 109, 115 and through inlet duct 172 into the capsule spinner assembly 100. The screws 110, 116, when assembled as shown, also mount and retain the capsule spinner assembly 100 in the cradle 102, in such a manner that the housing 140 can be pivoted about the axis of the screws 110, 116 to orient the rotor cavity 142 in the housing 140 at the magic angle or at any other desired angle. Once the housing 140 is oriented at the desired angle in the cradle 102, and the screws 110, 116 are tightened, the housing 140 will remain at the that angle.

The inlet header 64 is comprised of a vertical tube 65 that is internally threaded and adapted to receive the threaded end 72 of gas feeder tube 70 shown in FIG. 3. The left and right branch tubes 66, 67, respectively, of inlet header 64 are sized to be inserted into the ducts 109, 115 in cradle 102. Therefore, pressurized gaseous fluid is introduced into the probe 10 through the gas feeder tube 70 and into the inlet header 64. The inlet header 64 directs the flow of inlet gaseous fluid into the ducts 109, 115 in cradle 102 and then into opposite sides of the inlet duct 172 in capsule spinner assembly 100.

This structure, therefore, has a number of advantages over prior art NMR spinners. The combination of the smooth, bullet shaped capsule 120 with the lateral end bearing 180 and end stator drive 150 allows the capsule to be inserted into and removed from the rotor cavity 142 quickly and easily without disassembly. The placement of the bearing 180 around the opening of the rotor cavity 142 so it is positioned only around the end 138 of capsule 120 allows the use of capsules made of inexpensive materials, such as plastics, that have some distortion during spinning, and it is not so necessary to pack the sample material M in the capsule so meticulously as in prior art devices. The air bearing positioned only at the end 138 of capsule 120, with its jet streams of gaseous fluid directed radially inward onto the capsule surface at right angles to the tangent thereof, also allows low tolerance spacing between the bearing face and the surface of the capsule, while still very effectively maintaining the precise desired angle during spinning. This combination of the convenience and accuracy has not been obtained in prior art spinners. Further, the efficient vane structure and the unique probe structure of this invention are conducive to very cold temperature, low pressure measurements with cryogenic fluids, and the probe structure provides more convenient and efficient access than heretofore available in NMR apparatus with rapid sample spinning.

While the present invention has been described with some degree of particularly, it should be appreciated that the present invention is defined by the following claims construed in light of the prior art so that modifications or changes may be made to the preferred embodiment of the present invention without departing from the inventive concepts contained herein.

What we claim is:

1. High speed sample spinning apparatus, comprising:
   rotor means for spinning a sample, said rotor means having a first section in the shape of an elongated cylinder of uniform diameter along its entire length and a second section extending axially outwardly from one end of said cylindrical first section, said second section being tapered from a base at its proximal end to a point of convergence at its distal end on a line extending outward from the longitudinal axis of said cylindrical first section, said base of said tapered second section being the same diameter as said cylindrical first section;
   spinning and axial end bearing means for imparting rotary motion to said rotor means and for supporting said tapered second section of said rotor means, said spinning and end bearing means being comprised of a bearing body having a cavity therein with an open end adapted to receive therein said tapered second section, and a plurality of ports in said bearing body adapted to direct jet streams of gaseous fluid into said cavity in angular spaced apart relation to each other around the circumference thereof in such a manner as to produce a vortical air flow in said cavity, and a plurality of vanes in angular spaced apart relation to each other around the peripheral surface of said tapered second section adapted to impart rotational motion to said rotor means upon impact thereon by said vortical air flow; and
   lateral bearing means for maintaining said rotor means in longitudinal axial alignment with the longitudinal axis of said cavity, said lateral bearing means including a ring positioned coaxially with said cavity a spaced distance outward from the open end of said cavity a sufficient distance to be around the peripheral surface of said cylindrical first section adjacent the end of said cylindrical first section that is opposite said tapered second section, and a plurality of ports in said ring adapted to direct a jet streams of gaseous fluid onto said cylindrical second section in spaced apart relation around the circumference thereof.

2. The high speed sample spinning apparatus of claim 1, wherein said ports in said lateral bearing means are oriented to direct said jet streams of gaseous fluid radially inward onto said cylindrical second section at right angles to the peripheral surface thereof.

3. The high speed sample spinning apparatus of claim 1, wherein said tapered second section is in the shape of a right circular cone having a longitudinal axis in straight linear alignment with the longitudinal axis of said cylindrical first section and a plurality of vanes in the form of slotted channels in the conical surface of the tapered second section, said slotted channels extending inwardly from the conical surface to intersect with the cylindrical surface of said first section in angularly spaced apart relation to each other and slanted toward the longitudinal axis.

4. The high speed sample spinning apparatus of claim 3, wherein said slotted channels are slanted toward the longitudinal axis at an angle in the range of 10 to 20 degrees.

5. The high speed sample spinning apparatus of claim 4, wherein said slotted channels are slanted toward the longitudinal axis at an angle of about 15 degrees.

6. The high speed sample spinning apparatus of claim 3, wherein said slotted channels extend inwardly at an angle to the radius of the base of the conical end section.

7. The high speed sample spinning apparatus of claim 4 or 6, wherein said slotted channels extend inwardly at an angle to the radius of the base in the range of 35 to 55 degrees.

8. The high speed sample spinning apparatus of claim 7, wherein said slotted channels extend inwardly at an angle of about 45 degrees to the radius of the base.

9. The high speed sample spinning apparatus of claim 2, wherein the length of said ring is less than one-half the length of said cylindrical first section and there is an open space between the ring and the spinning and axial end bearing means.

10. The high speed sample spinning apparatus of claim 1, wherein said ring is positioned between the inside of said ring and outside peripheral surface of said cylinder is in the range of 0.003 to 0.007 inch.

11. The high speed sample spinning apparatus of claim 1, wherein the length of said elongated cylinder is at least two times the diameter thereof.

12. High speed sample spinning apparatus, comprising:
- a housing body having a cylindrical rotor cavity extending inwardly from one side thereof;
- a spinning and axial bearing in the form of a concave cavity positioned at and closing the inner end of said rotor cavity and having a plurality of air jet ports therein directed into the rotor cavity;
- a lateral bearing positioned around the opening of said rotor cavity and having a plurality of air jet ports therein directed into the rotor cavity; and
- an antenna positioned around the inside surface of said rotor cavity between said spinning and axial bearing and said lateral bearing.

13. The high speed sample spinning apparatus of claim 12, including an enclosed bearing gas plenum around the exterior of said ring for distributing gaseous fluid evenly to said ports in said ring.

14. The high speed sample spinning apparatus of claim 13, including an enclosed stator gas plenum around the exterior surface of said spinning and axial bearing means for distributing gaseous fluid evenly to said ports in said bearing body.

15. The high speed sample spinning apparatus of claim 14, including a bearing supply duct extending through said housing body from said stator gas plenum to said bearing gas plenum for delivering gaseous fluid under pressure from said stator gas plenum to said bearing gas plenum.

16. The high speed sample spinning apparatus of claim 15, including fluid flow adjustment means in said bearing supply duct for regulating the flow of gaseous fluid from said stator gas plenum of said bearing gas plenum.

17. The high speed sample spinning apparatus of claim 15, including exhaust port openings in said housing body extending from the rotor cavity near the spinning and axial bearing means to the exterior of said housing body for allowing exhaust gas in said rotor cavity to escape.

18. The high speed sample spinning apparatus of claim 15, including an adjustable mounting structure for supporting said housing body in a magnetic field with the longitudinal axis of said rotor means oriented at a desired angle in a magnetic field, said mounting structure including a vertical side wall positioned adjacent said housing body, said side wall having a transverse hole therethrough and an air feeder duct in said side wall in communication with said transverse hold therein, said housing body also having a transverse inlet duct therein aligned with said transverse hole in said side wall and extending into said stator gas plenum, and a bolt screwed through said transverse hole into said side wall and into said inlet duct in said housing body, said bolt having a duct therein extending from said feeder duct to said inlet duct, said housing body being rotatable about the axis of said screw when not tightened and secured in fixed relation to said side wall when tightened.

19. The high speed sample spinning apparatus of claim 18, including an elongated cylindrical enclosure with said housing body and adjustable mounting structure positioned therein, an access opening in said cylindrical enclosure adjacent to the front of said rotor cavity from the exterior of said cylindrical enclosure, and an insulated cylindrical exhaust plenum slidably positioned around said housing body and adjustable mounting structure in said cylindrical enclosure, the outer surface of said exhaust plenum being adjacent the interior surface of said cylindrical enclosure and closing said access opening when positioned around said housing body, said exhaust plenum being slidable away from said access opening and away from said housing body to expose the rotor cavity opening in said housing body to the exterior of said cylindrical enclosure.

20. The high speed sample spinning apparatus of claim 18, including a screw extending outwardly from said exhaust plenum through said access opening to the exterior of said cylindrical enclosure and slots extending upwardly and downwardly respectively from the upper and lower edges of said access opening, said screw being positioned in said slots and tightenable against said cylindrical enclosure to retain said exhaust plenum in open and closed positions over the access opening.

21. An insulated mounting probe for positioning nuclear magnetic resonance spinner apparatus in a magnetic field, comprising:
an elongated cylindrical enclosure having an immovable base therein, said nuclear magnetic resonance spinner apparatus being positioned thereon inside said enclosure, said enclosure also having an access opening in the side thereof adjacent said spinner apparatus, and a movable cylindrical plenum positioned inside said enclosure, said plenum being slidable to a use position wherein said spinner apparatus is enclosed by the interior of said plenum and the exterior of said plenum closes said acess opening and being slidable to an open position.

22. The probe of claim 21, wherein said plenum includes an inner cylindrical sleeve sized to fit snugly around said spinner apparatus and an outer cylindrical sleeve sized to fit snugly over said access opening, the annular space between said inner and outer sleeves being filled with a thermal insulation material.

23. The probe of claim 22, including slots in said enclosure adjacent said access opening and a screw extending outward from said plenum through said enclosure, said screw being positionable in said slots and tightenable against said enclosure to retain said plenum in a position around said spinner apparatus and over said access opening and alternatively in an open position with said spinner apparatus exposed to the exterior through said access opening.

24. The probe of claim 22, including a gas feeder tube and a gas exhaust tube positioned concentrically around said gas feeder tube, both of which extend upwardly from said spinner apparatus, said gas feeder tube being connected to an inlet duct in said spinner apparatus and said gas exhaust tube being in open communication with the interior of said plenum to conduct exhausted gas therein to the exterior of said enclosure.

25. The probe of claim 23, including additional concentric tubes between said feeder and exhaust tubes and outside said exhaust tube to insulate said feeder and exhaust tubes from each other and from the exterior environment.

26. The probe of claim 23, including an electric heating coil adjacent said gas feeder tube for heating gaseous fluids conducted therethrough before entering the spinner apparatus.

27. The method of spinning a sample at a high speed and maintaining a constant axial attitude of said sample during spinning, comprising the steps of:
    placing a sample containing rotor in the form of an elonagted cylindrical container having a tapered end section, the sides of which tapered end sections are no wider than the cylindrical container and converge to its longitudinal axis and have a plurality of vanes in the peripheral surface thereof into an end bearing having a cavity formed therein to receive said tapered end section;
    positioning a circular ring bearing concentrically around the end of said cylindrical container that is opposite the tapered end section in such a manner that said ring bearing is a spaced distance away from said end bearing;
    directing a plurality of jet streams of gaseous fluid in angularly spaced apart relation to each other through said end bearing into said cavity and onto said vanes at an angular direction adapted to propel said container to spin at a high speed; and
    directing a plurality of jet streams of gaseous fluid in angularly spaced apart relation to each other through said ring bearing onto the peripheral surface of said cylindrical container.

28. The method of spinning a sample at a high speed with a constant axial attitude, including the steps comprising:
    positioning a circular ring bearing a spaced distance above and coaxially with an end bearing having a tapered cavity therein with sides converging from the cavity opening to the longitudinal axis of the cavity;
    placing the sample in an enlongated cylindrical rotor one end of which is tapered longitudinally outward and having a plurality of vanes in the peripheral surface of said tapered end in angular spaced apart relation to each other, the length of said rotor being about equal to the distance between the top of the ring bearing and the bottom of the cavity in the end bearing;
    inserting said rotor, tapered end first, through said ring bearing until said tapered end seats in said end bearing;
    directing a plurality of jet streams of gaseous fluid in angularly spaced apart relation to each other through said end bearing into said cavity and onto said vanes at an angular direction adapted to propel said capsule to spin; and
    directing a plurality of jet streams of gaseous fluid in angularly spaced apart relation to each other through said ring and onto the peripheral surface of said rotor.

29. The method of claim 28, including the step of directing said jet streams of gaseous fluid through said ring bearing radially inward and perpendicular to the tangent of said cylindrical rotor at the point of impact of the jet stream on the peripheral surface of the rotor.

30. The method of claim 29, including the step of maintaining a radial distance between the inside surface of said ring bearing and the external surface of said rotor in the range of 0.003 to 0.007 inch.

31. The method of claim 30, including the step of injecting said jet streams of gaseous fluid through said end and ring bearings at a pressure in the range of 25 p.s.i. to 50 p.s.i.

* * * * *